United States Patent
Yoneya

(10) Patent No.: US 8,847,207 B2
(45) Date of Patent: Sep. 30, 2014

(54) SEMICONDUCTOR DEVICE WITH BOTTOM GATE ORGANIC THIN-FILM TRANSISTOR, AND DISPLAY DEVICE AND ELECTRONIC EQUIPMENT WITH SAME

(75) Inventor: Nobuhide Yoneya, Kanagawa (JP)

(73) Assignee: Sony Corporation, Tokyo (JP)

( * ) Notice: Subject to any disclaimer, the term of this patent is extended or adjusted under 35 U.S.C. 154(b) by 468 days.

(21) Appl. No.: 12/762,030

(22) Filed: Apr. 16, 2010

(65) Prior Publication Data

US 2010/0271353 A1 Oct. 28, 2010

(30) Foreign Application Priority Data

Apr. 23, 2009 (JP) ................................. 2009-104675

(51) Int. Cl.
*H01L 51/00* (2006.01)
(52) U.S. Cl.
USPC ..................................... 257/40; 257/E51.018
(58) Field of Classification Search
CPC .............. H01L 51/0545; H01L 27/283; H01L 27/1214; H01L 27/12; H01L 27/3274; H01L 27/3244; H01L 27/3272
USPC ................ 257/40, E51.006, E51.018; 438/99
See application file for complete search history.

(56) References Cited

U.S. PATENT DOCUMENTS

| | | | |
|---|---|---|---|
| 2003/0197180 A1* | 10/2003 | Tsujimura et al. | 257/66 |
| 2005/0082541 A1* | 4/2005 | Satou | 257/72 |
| 2006/0223222 A1 | 10/2006 | Choi et al. | |
| 2007/0012916 A1 | 1/2007 | Choi et al. | |
| 2008/0265442 A1 | 10/2008 | Yagi | |
| 2009/0026444 A1* | 1/2009 | Choi et al. | 257/40 |
| 2011/0012097 A1* | 1/2011 | Yoneya | 257/40 |

FOREIGN PATENT DOCUMENTS

| | | |
|---|---|---|
| JP | 11-242241 | 9/1999 |
| JP | 2006-279053 | 10/2006 |
| JP | 2008-112136 | 5/2008 |
| JP | 2008-277370 | 11/2008 |

OTHER PUBLICATIONS

Japanese Office Action issued in connection with related Japanese Patent Application No. 2009-104675 dated Sep. 19, 2013.

* cited by examiner

*Primary Examiner* — Duy T Nguyen
(74) *Attorney, Agent, or Firm* — Dentons US LLP

(57) ABSTRACT

A semiconductor device includes first layer wiring including a gate electrode mounted on a substrate; a gate insulating film having an opening that exposes part of the first layer wiring and covering the entire surface of the substrate including the gate electrode; second layer wiring including a source electrode and a drain electrode mounted on the gate insulating film; an insulating partition layer having a first opening that exposes an edge between the source electrode and the drain electrode and a part of the gate insulating film between the source electrode and the drain electrode and a second opening that is aligned with the opening formed in the gate insulating film; and an organic semiconductor layer disposed across the source electrode and the drain electrode at the bottom surface of the first opening formed in the partition layer.

12 Claims, 10 Drawing Sheets

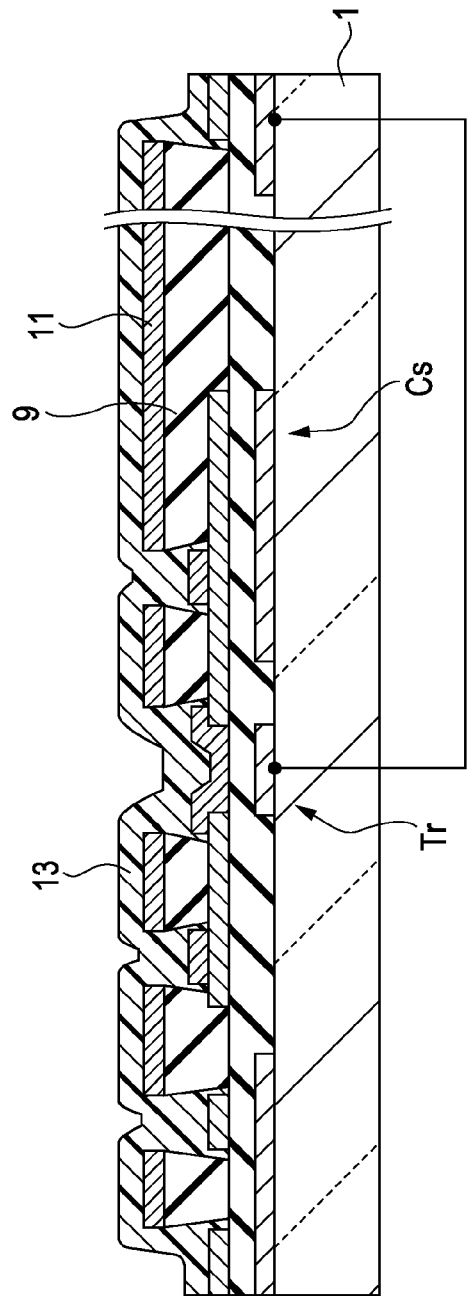
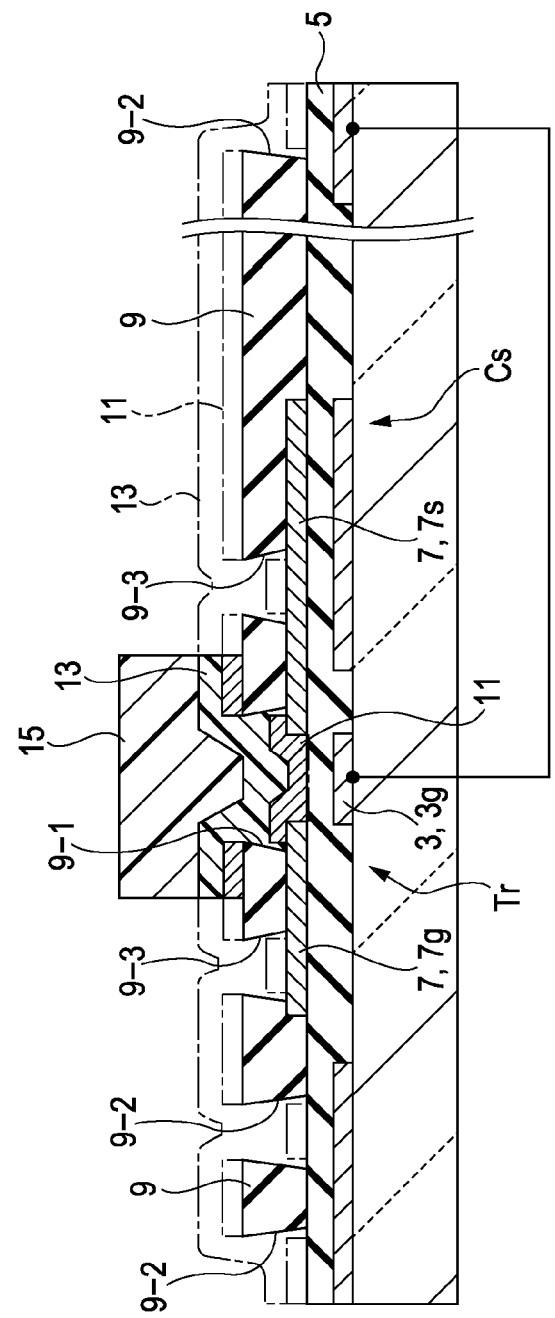
FIG. 2A
FIG. 2B

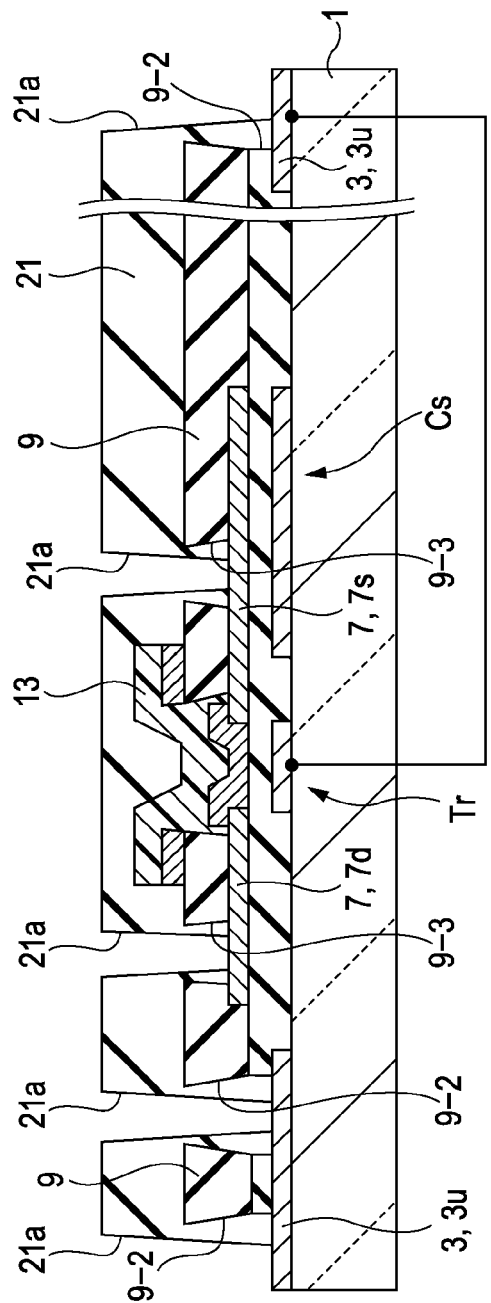
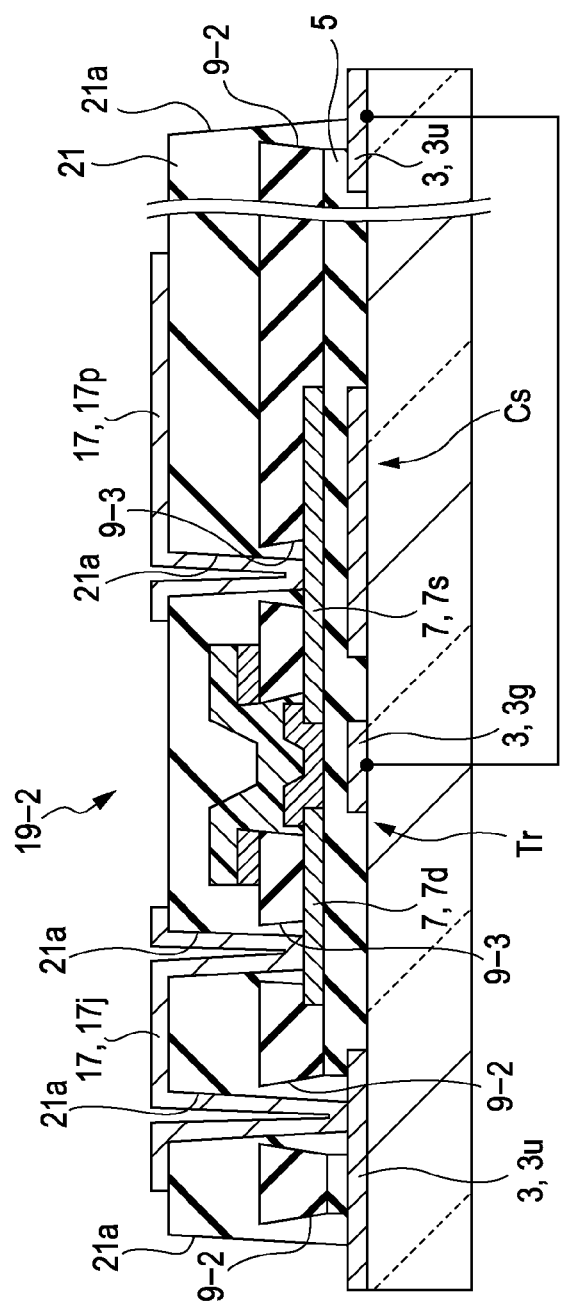
FIG. 4A
FIG. 4B

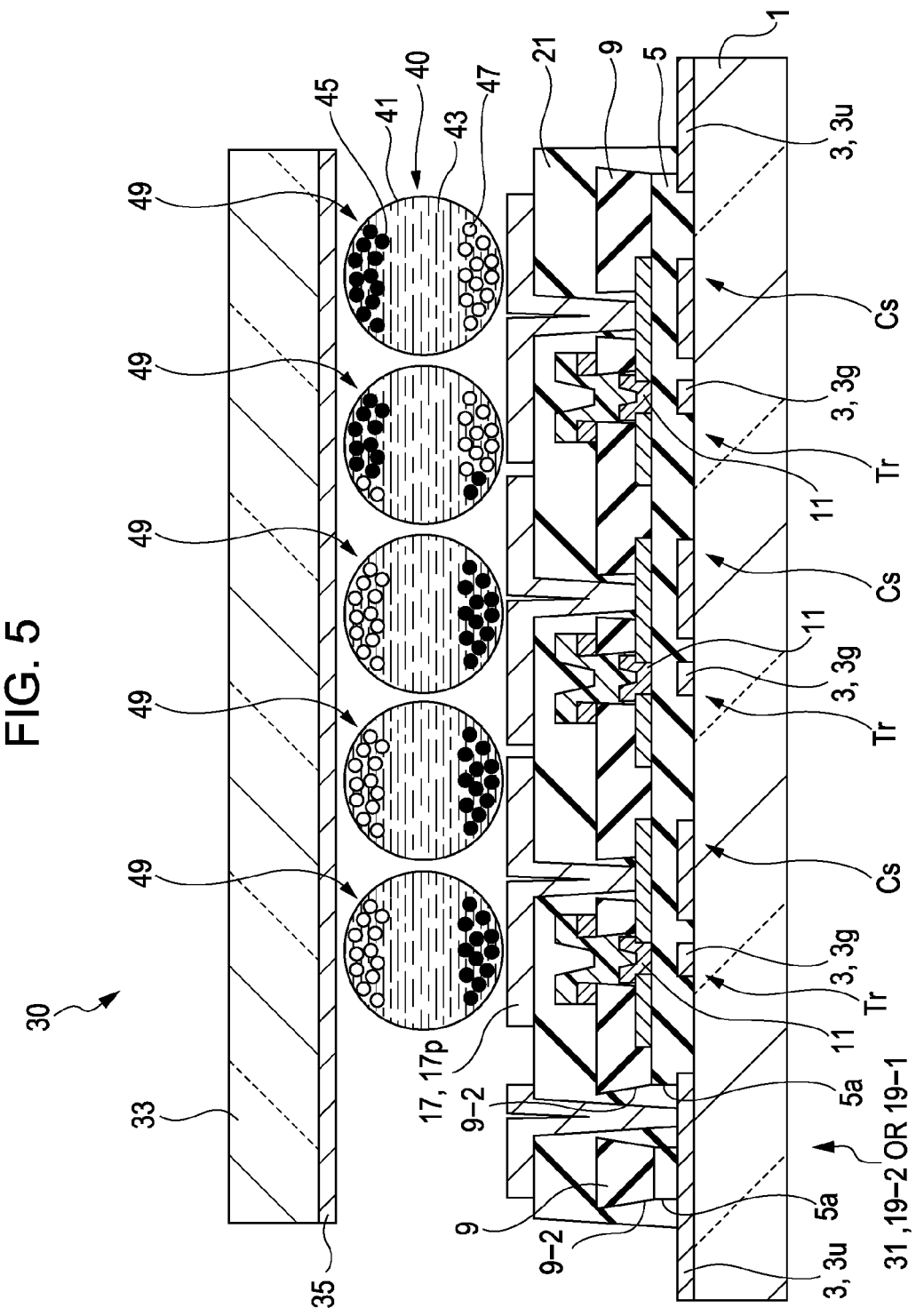

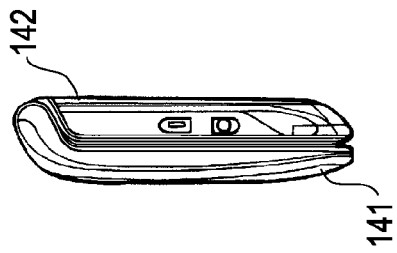
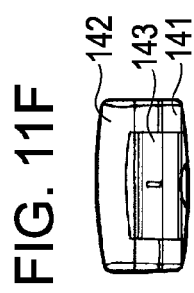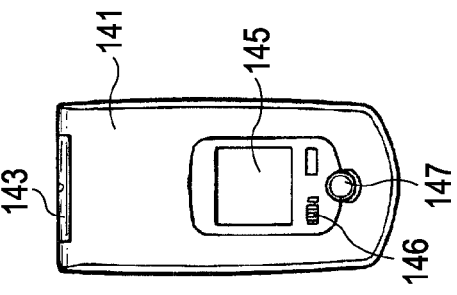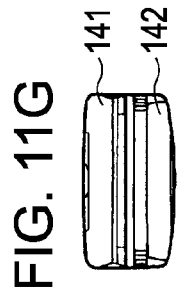
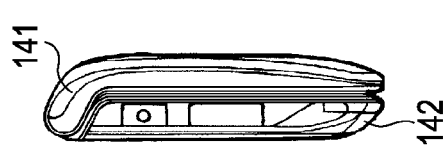
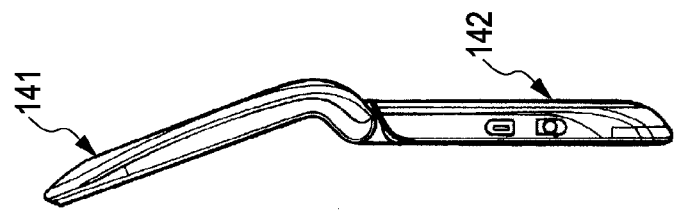
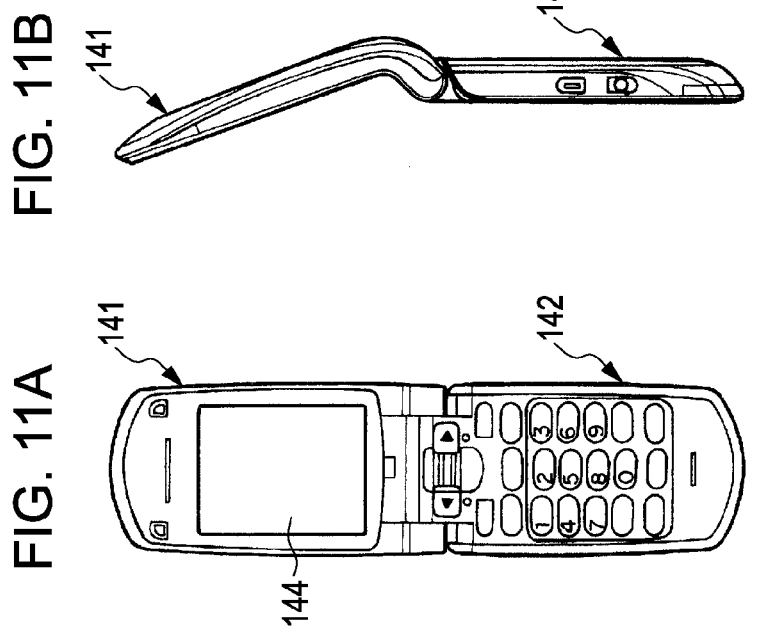

SEMICONDUCTOR DEVICE WITH BOTTOM GATE ORGANIC THIN-FILM TRANSISTOR, AND DISPLAY DEVICE AND ELECTRONIC EQUIPMENT WITH SAME

RELATED APPLICATION DATA

The present application claims priority to and contains subject matter related to that disclosed in Japanese Priority Patent Application JP 2009-104675 filed in the Japan Patent Office on Apr. 23, 2009, the entire content of which is hereby incorporated by reference.

BACKGROUND OF THE INVENTION

1. Field of the Invention

The present invention relates to a semiconductor device including a bottom-gate/bottom-contact organic thin-film transistor and a production method thereof, and more specifically, relates to a display device and electronic equipment including organic thin-film transistors.

2. Description of the Related Art

For a thin display device, it has been considered to use an organic thin-film transistor having an organic semiconductor layer in its channel section as a thin-film transistor for driving pixels. The production of such a substrate in the driving side of a display device is carried out as described below.

First, for example, patterns of a gate electrode, wiring connected thereto, and other wiring are formed on the substrate. Next, these are covered with a gate insulating film, and patterns of connection holes and so on are formed at predetermined section. Then, patterns of a source electrode and a drain electrode are formed on the gate insulating film. Next, a partition pattern that exposes the source electrode and the drain electrode is formed on the gate insulating film. Then, an organic semiconductor layer is segmented into islands formed by the different levels in the partition caused by deposition film-formation from above. Subsequently, after carrying out pattern formation on a protective film covering at least the organic semiconductor layer, upper layer wiring and pixel electrodes are formed in the upper part of the substrate on which the protective film is formed (refer to Japanese Unexamined Patent Application Publication No. 2008-277370 (FIG. 7)).

SUMMARY OF THE INVENTION

With, pattern formation according to the above-described production method, patterning using, for example, lithography techniques is carried out. However, when using lithography techniques, an exposure mask having an emission opening for exposure light is used, causing an increase in mask cost, and moreover, causing an increase in process time and reducing yield.

It is desirable that a semiconductor device and a production method thereof allow reductions in process time and production cost by optimizing the structure and reducing the number of patterning steps and provide a display device and electronic equipment including such semiconductor devices.

To obtain such semiconductor device, a production method thereof, a display device, and electronic equipment, the semiconductor device according to embodiments of the present invention includes a bottom-gate/bottom-contact organic thin-film transistor. The semiconductor device includes a partition layer having a first opening that exposes the end sections of a source electrode and a drain electrode and a section of a gate insulating film interposed between the source electrode and the drain electrode. An organic semiconductor layer is disposed inside the first opening. With such a structure, the partition layer has a second opening that is aligned with the opening formed in the gate insulating film.

An embodiment of the present invention provides a production method of a semiconductor device having such a structure. With the method, first, first layer wiring including a gate electrode, a gate insulating film, and second wiring including a source electrode and a drain electrode are formed, in this order, on a substrate. Next, an insulating partition layer is formed on the gate insulating film. This partition layer has a first opening that exposes the end sections of the source electrode and the drain electrode and a section of the gate insulating film interposed between the source electrode and the drain electrode. By forming the partition layer from above, pattern formation of a segment of the organic semiconductor layer segmented by the different levels of the partition layer is formed across the source electrode and the drain electrode at the bottom of the first opening. Then, a mask pattern that at least covers the organic semiconductor layer is formed, the mask pattern and the partition layer are masked, and the first layer wiring is exposed by removing, by etching, the gate insulating film at the second opening in the partition layer.

With the semiconductor device and the production method thereof, described above, without using a special mask, an opening can be formed in the gate insulating film by using the partition layer as a mask, and the first layer wiring can be exposed.

Another embodiment of the present invention also provides a display device using such a semiconductor device configuration. With this display device, a first opening, a second opening, and a third opening reaching the source electrode or the drain electrode are formed in the partition layer. Furthermore, a pixel electrode is disposed on the partition layer in such a manner that the pixel electrode is connected to the source electrode and the drain electrode via the third opening. Another embodiment of the present invention provides such a display device and a driving device that drives the display device.

As described above, since embodiments of the present invention provide a semiconductor device capable of exposing first layer wiring by forming an opening in the gate insulating film, without using a special mask, a patterning process using a mask, such as a lithography process, can be eliminated. As a result, process time and production cost can be reduced with the semiconductor device, a display device and electronic equipment equipped with such a semiconductor device. Moreover, an improvement in yield can be achieved by reducing the process steps.

BRIEF DESCRIPTION OF THE DRAWINGS

FIG. 2 illustrates a sectional process diagram (part 2) illustrating a production method of a semiconductor device according to a first embodiment.

FIG. 4 illustrates a sectional process diagram illustrating a characteristic of a production method of a semiconductor device according to a second embodiment.

FIG. 5 is a sectional view illustrating an example of a display device according to a third embodiment.

FIG. 8A is a perspective view from the front and FIG. 8B is a perspective view from the back.

FIGS. 11A to 11G are perspective views illustrating a portable terminal device using a display device according to an embodiment of the present invention as electronic equipment according to a fourth embodiment, where FIG. 11A is a front view in an open state, FIG. 11B is a side view in the open state, FIG. 11C is a front view in a closed state, FIG. 11D is a left side view, FIG. 11E is a right side view, FIG. 11F is top view, and FIG. 11G is bottom view.

DESCRIPTION OF THE PREFERRED EMBODIMENTS

Embodiments of the present invention are described in the following order with reference to the drawings:

1) a first embodiment (an example of a semiconductor device with third layer wiring provided on a partition layer);

2) a second embodiment (an example of a semiconductor device with third layer wiring provided on an inter-layer insulating film covering a partition layer);

3) a third embodiment (an example of application to a display device); and 4) a fourth embodiment (an example of application to electronic equipment).

First Embodiment

In a first embodiment, a production method of a semiconductor device that is to be used as a back plane (back driving substrate) of a display device is described as a semiconductor device that uses a bottom-gate/bottom-contact type organic thin-film transistor.

Figure 1A:
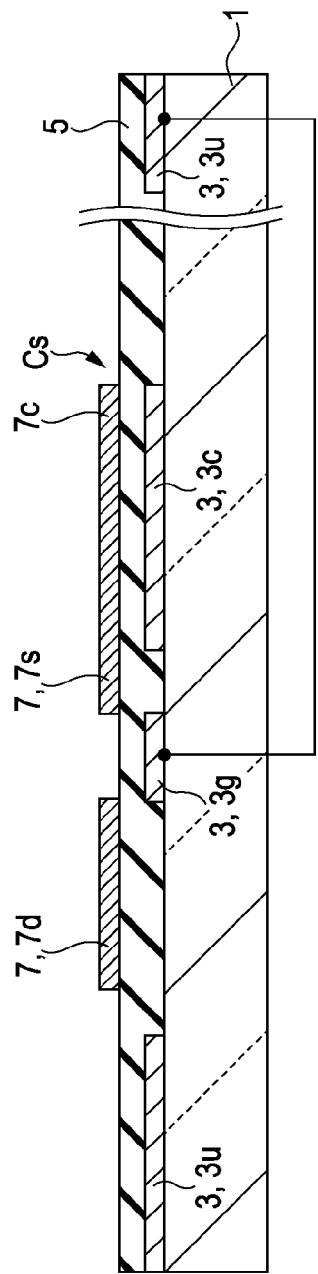
FIGS. 1A to 1C illustrate a sectional process diagram (part 1) illustrating a production method of a semiconductor device according to a first embodiment.

First, as shown in FIG. 1A, a substrate 1 of which at least the front surface is insulated is provided. Then, on this substrate 1, patterns of a gate electrode 3g, a lower-section electrode 3c, which is a capacitive element, and a plurality of extraction electrodes 3u are formed as first layer wiring 3. Among the first layer wiring 3, the extraction electrodes 3u are wired by extracting them from the edges of the substrate 1. Some of the extraction electrodes 3u form, for example, the end sections of scanning lines extending from the gate electrode 3g.

Patterns of the first layer wiring 3 are formed using, for example, lithography techniques, as described below. First, a conductive material film formed of a metal material, such as gold (Au), chrome (Cr), titanium (Ti), copper (Cu), platinum (Pt), or silver (Ag), a metal dispersion material, such as silver paste, or a conductive polymer, such as Poly(3,4-ethylenedioxythiophene)/Poly(stylenesulfonic acid) (PEDOT/PSS) or polyaniline, is formed on the substrate 1. As the method of forming the conductive material film, a method that suits the material to be used may be employed. For example, for a metal material film, sputtering, deposition, CVD, or printing may be employed. Next, a lithographic method, such as electron beam lithography or photo-lithography, is employed to form a resist pattern on the conductive material film. Then, the resist pattern is used as a mask to etch the conductive material film to form the pattern of the above-described first layer wiring 3.

Pattern formation of the first layer wiring 3 is not limited to the method described above. For example, a lithography technique such as liftoff may be employed. Moreover, a printing method, such as inkjet, micro-contact, or screen printing or a mask deposition, may be employed.

Next, a gate insulating film 5 is formed on the entire surface of the substrate 1 in such a manner that the first layer wiring 3 is covered. The gate insulating film 5 may be a film formed of a material having an insulating property, such as an organic insulating material, an inorganic insulating material, or an inorganic composite material. As an organic insulating material, polyvinylphenol, polyimide, polymethylmethacrylate, or the like may be used. As an inorganic insulating material, silicon oxide ($SiO_2$), silicon nitride (SiN), or aluminum oxide ($Al_2O_3$) is used. These materials may be combined into a composite material and may be used in a single layer or a laminate. As a method of forming the gate insulating film 5 from any of these materials, a method that suits the material to be used may be selected. For example, a printing method, such as spin coating, stamping, inkjet, slit coating, cap coating, or screen printing, deposition, sputtering, or CVD may be employed.

Subsequently, on the gate insulating film 5, patterns of a source electrode 7s, a drain electrode 7d, and an upper-section electrode 7c, which is a capacitive element, are formed as second layer wiring 7. For pattern formation of the second layer wiring 7, a method of pattern formation used for the first layer wiring 3 is employed. Here, the source electrode 7s and the drain electrode 7d are mounted with the edges align with both side of the gate electrode 3g in the width direction. The upper-section electrode 7c is disposed, for example, continuously from the source electrode 7s. A capacitive element Cs is formed by interposing the gate insulating film 5 between the upper-section electrode 7c and the lower-section electrode 3c.

Figure 1B:
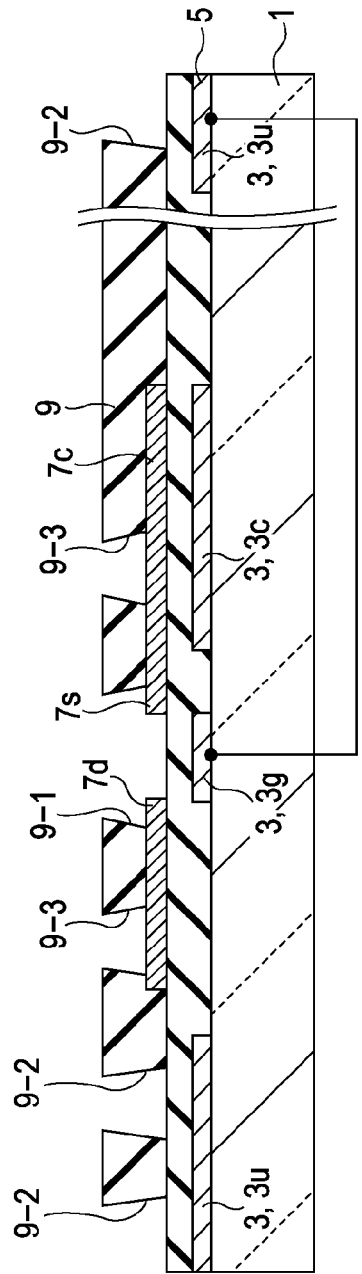

Next, as shown in FIG. 1B, an insulating partition layer 9 is formed on the gate insulating film 5, on which the second layer wiring 7 including the source electrode 7s, the drain electrode 7d, and the upper-section electrode 7c is formed. The partition layer 9 has a first opening 9-1, second openings 9-2, and third openings 9-3.

The first opening 9-1 is formed in the gate electrode 3g in such a shape that the opposing ends of the source electrode 7s and drain electrode 7d and a section of the gate insulating film 5 interposed between the electrodes 7s and 7d are exposed continuously.

The second openings 9-2 are formed directly above sections of the first layer wiring 3 that are to be exposed through the gate insulating film 5. Here, three respective second openings 9-2 are formed to expose ends section of the extraction electrodes 3u extending to the periphery of the substrate 1 and other predetermined sections.

The third openings 9-3 reach at least one of the source electrode 7s and the drain electrode 7d. Here, two third openings 9-3 that respectively reach the source electrode 7s and the drain electrode 7d are illustrated as an example. Instead, however, one or more than three third openings 9-3 may be formed.

It is important that the partition layer 9 is formed in such a manner that segments of an organic semiconductor layer, which is formed in a subsequent step, are formed in the upper and lower areas of the partition layer 9.

Therefore, the partition layer 9 is, for example, formed with a sufficient film thickness and in such a manner that the side walls of the opening 9-1 to 9-3 are vertical or, more suitably, tapered toward the upper part of the openings. To form the partition layer 9 in such a manner, after the formation material film of the partition layer 9 is formed by spin coating, a resist pattern is formed on the formation material film using a lithography technique, and then, the formation material film is etched using a mask. Instead, the partition layer 9 may be formed by carrying out a lithography process on a negative resist (for example, TELR-N101PM (trademark of Tokyo Ohka Kogyo Co., Ltd.)).

For example, when the organic semiconductor layer described below is formed by an application method, the partition layer 9 may be formed by carrying out pattern formation using an insulating material that repels an application solution containing an organic semiconductor material, or liquid-repellant processing may be applied selectively to the exposed surface of the partition layer 9. In such a case, the side walls of the partition layer 9 may be tapered toward the lower part of the openings.

Figure 1C:
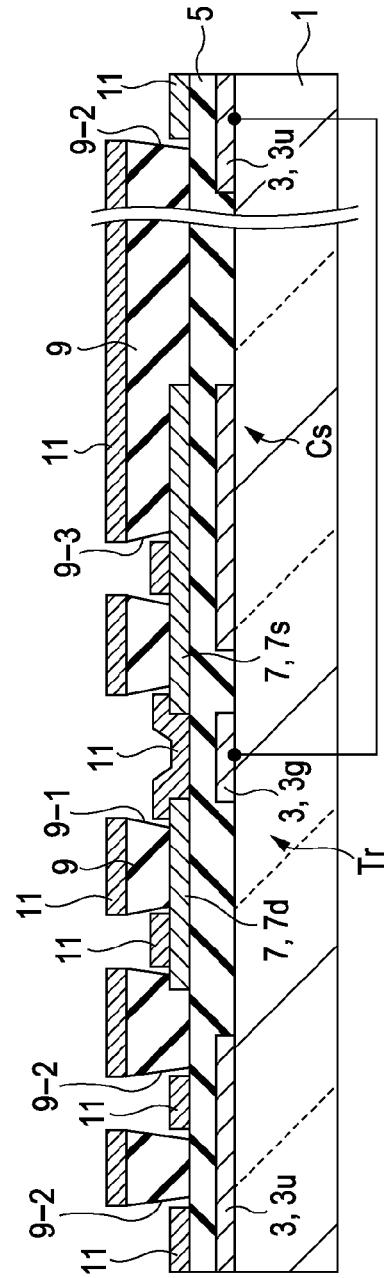

Next, as shown in FIG. 1C, by depositing the organic semiconductor material from above the partition layer 9, segments of an organic semiconductor layer 11 are formed at the upper and lower areas of the partition layer 9. In this way, at the bottom of the first opening 9-1, a segment of the organic semiconductor layer 11 that constitutes a channel section across the source electrode 7s and the drain electrode 7d is formed. Moreover, in this way, at the bottom of the second openings 9-2 and the third openings 9-3 and at the upper area of the partition layer 9, patterned segments of the organic semiconductor layer 11 segmented by the different levels of the partition layer 9 are formed.

The organic semiconductor material used here is, for example, pentacene, anthracene, phthalocyanine, porphyrin, thiophene-based polymers, or a derivative thereof.

When the exposed surface of the partition layer 9 is liquid repellant, the organic semiconductor layer 11 may be formed using an application film forming method, such as stamping, screen printing, cap coating, inkjet, slit coating, or spin coating.

As described above, a bottom-gate/bottom-contact organic thin-film transistor Tr is formed on the substrate 1. This organic thin-film transistor Tr is configured such that the source electrode 7s is connected to the capacitative element Cs.

Next, as shown in (1) of FIG. 2, an insulating protective film 13 is formed on the entire surface of the substrate 1 in such a manner that it covers the partition layer 9 and the organic semiconductor layer 11. The protective film 13 is composed of, for example, fluorine resin material or a water-soluble polymer, such as a poly(p-Xylylene) derivative or polyvinyl alcohol. As a method of forming the protective film 13 from any of these materials, a method that suits the material to be used may be selected. For example, a printing method, such as spin coating, stamping, inkjet, slit coating, cap coating, or screen printing, deposition, sputtering, or CVD may be employed. Then, the protective film 13 is formed in such a manner that it covers at least the organic semiconductor layer 11 in the first opening 9-1.

Subsequently, as shown in (2) of FIG. 2, a lithography technique is used to form a resist pattern 15 that completely covers the first opening 9-1 is formed on the protective film 13. Then, the protective film 13 and the organic semiconductor layer 11 are removed by etching performed by masking the resist pattern 15. For this etching, for example, a dry etching method is employed, and an etching gas that suits the etching to be performed on the material of the protective film 13 is selected. Here, dry etching by, for example, oxygen plasma is employed. By such etching, the surface of the partition layer 9 is exposed; the gate insulating film 5 is exposed at the bottom of the second openings 9-2; and the source electrode 7s and the drain electrode 7d are exposed at the bottom of the third openings 9-3.

Subsequent to the processes described above, as shown in (1) of FIG. 3, the resist pattern 15 and the partition layer 9 are masked; the gate insulating film 5 exposed at the bottom of the second openings 9-2 are removed by etching; and openings 5a aligned with the second openings 9-2 are formed in the gate insulating film 5. Such etching may be carried out immediately after the removal of the organic semiconductor layer 11 by etching, or the etching gas to be sued and/or other etching conditions may be changed. By etching the gate insulating film 5 in such a manner, the end sections of the extraction electrodes 3u and parts of the extraction electrodes 3u are exposed.

When the resist pattern 15 is removed when the protective film 13 and the organic semiconductor layer 11 are removed by etching, pattern etching is carried out on the gate insulating film 5 by using both the partition layer 9 and the protective film 13 as mask patterns.

Figure 3A:
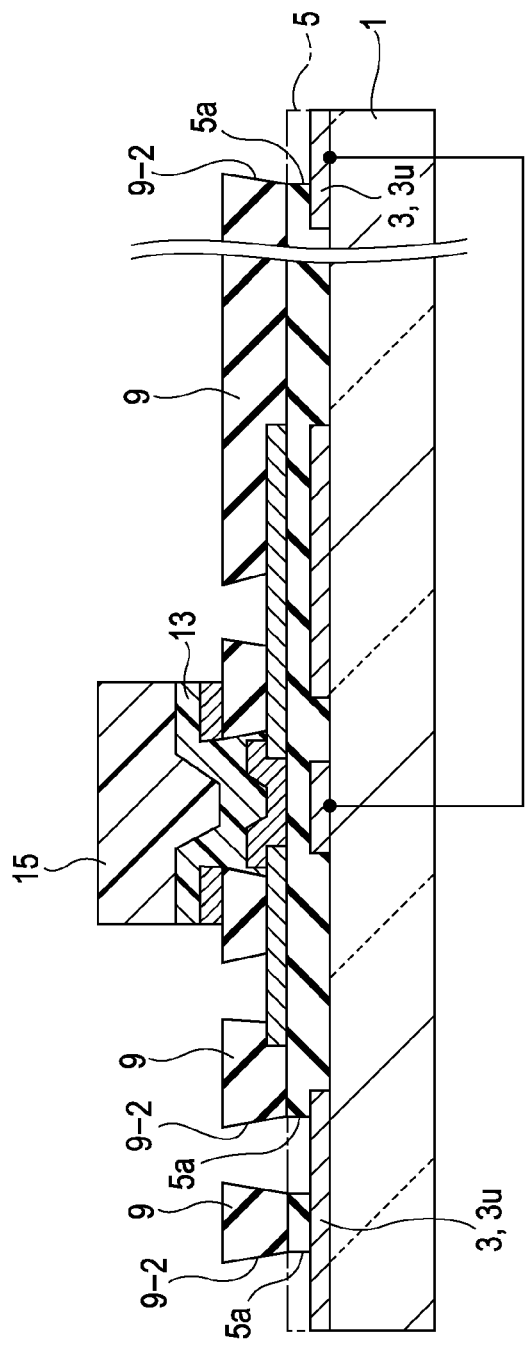
FIG. 3 illustrates a sectional process diagram (part 3) illustrating a production method of a semiconductor device according to a first embodiment.
Figure 3B:
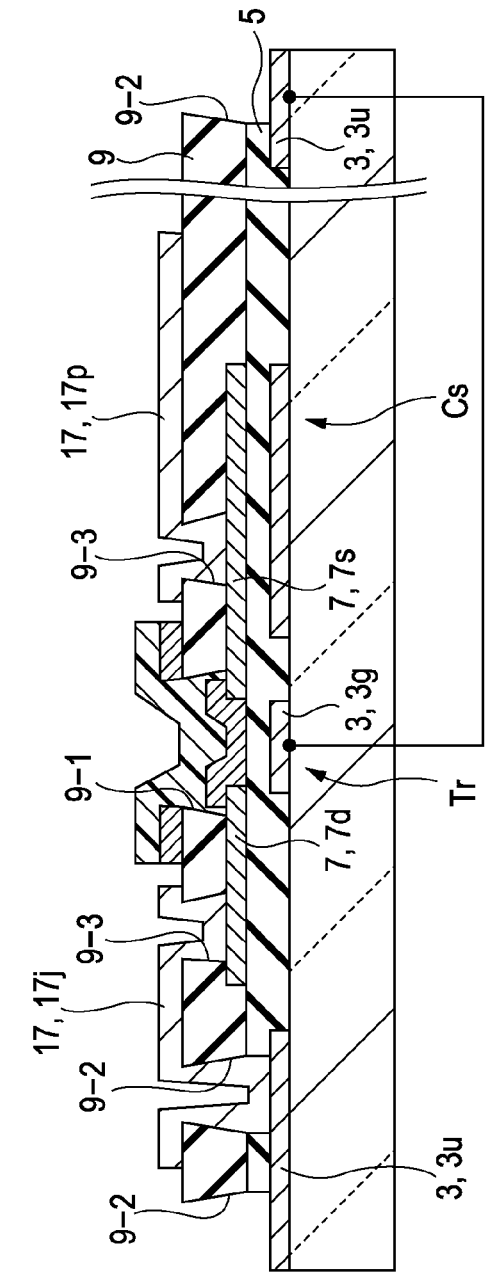

Next, as shown in (2) of FIG. 3, patterns of third layer wiring 17 are formed on the partition layer 9. For pattern formation of the third layer wiring 17, a method described in the pattern formation of the first layer wiring 3 is employed. The third layer wiring 17 includes, for example, a pixel electrode 17p of the display device and connection wiring 17j for inter-layer connection that connects the second layer wiring 7 and the first layer wiring 3. The pixel electrode 17p is, for example, connected to the source electrode 7s via one of the third openings 9-3. The connection wiring 17j is, for example, connected to one of the extraction electrodes 3u of one of the second openings 9-2 of the partition layer 9 and is connected to the drain electrode 7d via one of the third openings 9-3. The drain electrode 7d and the gate electrode 3g are connected to different extraction electrodes 3u.

As described above, the acquired semiconductor device 19-1 is provided with the organic thin-film transistor Tr and the capacitative element Cs, in addition to the third layer wiring 17, such as the pixel electrode 17p and the connection wiring 17j, that are formed on the partition layer 9 covering the organic thin-film transistor Tr and the capacitative element Cs.

The semiconductor device 19-1 includes the organic thin-film transistor Tr having a bottom-gate/bottom-contact structure in which the gate electrode 3g, the gate insulating film 5, the source electrode 7s, the drain electrode 7d, and the organic semiconductor layer 11 are disposed on the substrate 1 in this order. The organic semiconductor layer 11 is formed of segments disposed at the different levels in the partition layer 9, where the segment constituting the channel section is disposed at the bottom of the first opening 9-1. In particular, the partition layer 9 has the second openings 9-2 that align with the openings 5a in the gate insulating film 5 in addition to the first opening 9-1 where the organic semiconductor layer 11 is formed.

At the bottom of the openings 5a formed in the gate insulating film 5 and the second openings 9-2 formed in the partition layer 9, the end of an extraction electrode 3u extending from the gate electrode 3g and the end of another extraction electrodes 3u connected to the drain electrode 7d are exposed as the first layer wiring 3 formed in the same layer as the gate electrode 3g. In this way, external circuits can be connected to the gate electrode 3g and the drain electrode 7d.

The third openings 9-3 that reach the second layer wiring 7 are formed in the partition layer 9. The pixel electrode 17p connected to the source electrode 7s via one of the third openings 9-3 and the connection wiring 17j connecting the drain electrode 7d and one of the extraction electrodes 3u via another third openings 9-3 and one of the second openings 9-2 are formed as the third wires 17 on the partition layer 9.

According to the first embodiment, with a configuration including the organic thin-film transistor Tr having a bottom-gate/bottom-contact structure, when the first layer wiring 3 is exposed, etching of the gate insulating film 5 is carried out by masking the partition layer 9, which is used for pattern formation of the organic semiconductor layer 11. In this way, a special etching mask is not used, and the first layer wiring 3 can be exposed by forming openings in the gate insulating film 5.

As a result, patterning processes, such as a lithography process, can be eliminated, and process time and production costs associated with the production of the semiconductor device 19-1 can be reduced. Moreover, an improvement in yield can be achieved by reducing the process steps.

Second Embodiment

FIG. 4 illustrates steps characteristic in the production method of a semiconductor device of a second embodiment. The second embodiment illustrated in the drawing differs from the first embodiment in that an inter-layer insulating film 21 is disposed on the partition layer 9 and the protective film 13, and third layer wiring 17 are mounted on the upper area of the inter-layer insulating film 21. The production process of the second embodiment is described below.

First, similar to the steps in the first embodiment described with reference to FIG. 1A to FIG. 2B, patterns of extraction electrodes 3u, an organic thin-film transistor Tr having a bottom-gate/bottom-contact structure, a capacitative element Cs, a partition layer 9, and a protective film 13 are formed on a substrate 1. With pattern formation of the protective film 13, similar to the step in the first embodiment described with reference to (2) of FIG. 2, pattern etching of a is carried out on the protective film 13 by using resist pattern (15) as a mask, and then, the organic semiconductor layer 11 is removed by etching. After etching, the resist pattern (15) is removed.

Subsequently, in the second embodiment, as shown in (1) of FIG. 4, the inter-layer insulating film 21 is formed in such a manner that it covers the protective film 13 and the partition layer 9, and patterns of openings 21a are formed in the inter-layer insulating film 21. Here, the openings 21a are formed inside second openings 9-2 and third openings 9-3 in the partition layer 9 and expose, at the bottom surfaces, the extraction electrodes 3u, which are included in the first layer wiring 3, and the source electrode 7s and the drain electrode 7d, which are included in the second layer wiring 7.

For example, pattern formation of the inter-layer insulating film 21 is carried out by, for example, using a lithography technique on photo-sensitive resin material. In such a case, photo-sensitive resin material is applied to form a film. By carrying out pattern exposure and development processing on this film, the inter-layer insulating film 21 having the openings 21a is formed.

The method of pattern formation of the inter-layer insulating film 21 is not limited to that described above. The pattern formation may be carried out by forming an insulating material film and then performing pattern etching on this material film. The inter-layer insulating film 21 may be any type of film made of an insulating material, such as an organic insulating material, and inorganic insulating material, or an inorganic composite material. As an organic insulating material, polyvinylphenol, polyimide, polymethylmethacrylate, and so on may be used. As an inorganic insulating material, silicon oxide ($SiO_2$), silicon nitride (SiN), or aluminum oxide ($Al_2O_3$) is used. These materials may be combined into a composite material and may be used in a single layer or a laminate. As a method of forming the inter-layer insulating film 21 from any of these materials, a method that suits the material to be used may be selected. For example, a printing method, such as spin coating, stamping, inkjet, slit coating, cap coating, or screen printing, deposition, sputtering, or CVD may be employed. Pattern etching on the inter-layer insulating film 21 may be performed using a resist pattern as a mask.

Subsequently, as shown in (2) of FIG. 4, patterns of the third layer wiring 17 are formed on the inter-layer insulating film 21. For pattern formation of the third layer wiring 17, a method described for the pattern formation of the first layer wiring 3 is employed. The third layer wiring 17 includes a pixel electrode 17p of the display device and connection wiring 17j that connects the second layer wiring 7 and the first layer wiring 3. The pixel electrode 17p is, for example, connected to the drain electrode 7d via one of the openings 21a formed in a third opening 9-3 of the partition layer 9. The connection wiring 17j is, for example, connected to one of the extraction electrodes 3u via one of the second openings 9-2 in the partition layer 9 and is connected to the drain electrode 7d via one of the third openings 9-3. The drain electrode 7d and the gate electrode 3g are connected to different extraction electrodes 3u.

As described above, an acquired semiconductor device 19-2 is provided with the organic thin-film transistor Tr and the capacitative element Cs, in addition to the third layer wiring 17, such as the pixel electrode 17p and the connection wiring 17j, that is formed on the partition layer 9 covering the organic thin-film transistor Tr and the capacitative element Cs, where the inter-layer insulating film 21 is interposed between the partition layer 9 and the third layer wiring 17.

Similar to the semiconductor device in the first embodiment, the semiconductor device 19-2 includes the bottom-gate/bottom-contact organic thin-film transistor Tr, and a segment of the organic semiconductor layer 11 constituting the channel section is formed at the bottom of the first opening 9-1 due to the different levels in the partition layer 9. Similar to the first embodiment, the partition layer 9 has the second openings 9-2 that are aligned with the openings 5a in the gate insulating film 5 in addition to the first opening 9-1 where the organic semiconductor layer 11 is formed.

At the bottom of the openings 5a in the gate insulating film 5 and the second openings 9-2 formed in the partition layer 9, the end of an extraction electrode 3u extending from the gate electrode 3g and the end of another extraction electrodes 3u connected to the drain electrode 7d are exposed as the first layer wiring 3 formed in the same layer as the gate electrode 3g. Furthermore, the third openings 9-3 that reach the second layer wiring 7 are formed in the partition layer 9.

The partition layer 9 is covered with an inter-layer insulating film 21. In the inter-layer insulating film 21, openings 21a that reach the bottom of the second openings 9-2 and the third openings 9-3 in the partition layer 9 are formed. The bottom of the second openings 9-2 and the third openings 9-3 formed in the partition layer 9 are exposed inside the openings 21a. In this way, external circuits can be connected to the gate electrode 3g and the drain electrode 7d via the extraction electrodes 3u exposed at the bottom of the second openings 9-2.

On the inter-layer insulating film 21, the pixel electrode 17p connected to the source electrode 7s via one of the third openings 9-3 and the connection wiring 17j connecting the drain electrode 7d and one of the extraction electrodes 3u via another third openings 9-3 and one of the second openings 9-2 are formed.

With the configuration including the bottom-gate/bottom-contact organic thin-film transistor Tr according to the second embodiment, to expose the first layer wiring 3, etching of the gate insulating film 5 masking the partition layer 9 used for pattern formation of the organic semiconductor layer 11 is carried out. In this way, a special etching mask is not used, and the first layer wiring 3 can be exposed by forming openings in the gate insulating film 5.

As a result, similar to the first embodiment, lithography processes can be eliminated, and process time and production costs associated with the production of the semiconductor device 19-2 can be reduced. Moreover, an improvement in yield can be achieved by reducing the process steps.

Third Embodiment
Layer Structure of Display Device

FIG. 5 illustrates an example of a display device according to an embodiment of the present invention and is a schematic sectional view illustrating three pixels and their periphery in an electrophoretic display device using the semiconductor device according to an above-described embodiment as a back driving substrate (back plane). Here, the semiconductor device 19-2 described in the second embodiment is illustrated as a backplane 31. Instead, however, the semiconductor device 19-1 of the first embodiment may also be used as the backplane 31. In FIG. 5, the connection wiring in the semiconductor device 19-2 (backplane 31) is not shown.

A display device 30 of this embodiment illustrated in the drawing is an electrophoretic display device 30 configured with an opposing substrate 33 disposed on a pixel electrode 17p side of the backplane 31 applying the above-described semiconductor device 19-2 and with an electrophoretic medium layer 40 containing electrophoretic particles interposed between the backplane 31 and the opposing substrate 33.

In each pixel on the back plane 31 side, the bottom-gate/bottom-contact organic thin-film transistor Tr described above, and the capacitative element Cs and the pixel electrode 17p connected to the organic thin-film transistor Tr are provided. The gate electrodes 3g of the organic thin-film transistor Tr mounted on respective pixels are connected to the respective extraction electrodes 3u via scanning lines (not shown). The drain electrodes 7d of the organic thin-film transistor Tr mounted on respective pixels is connected to the respective extraction electrodes 3u via connection wiring (not shown) constituting third layer wiring. The drain electrodes 7d and the gate electrodes 3g are connected to respective extraction electrodes 3u.

In particular, the ends of the extraction electrodes 3u are aligned with the second openings 9-2 formed in the partition layer 9 and are exposed at the bottoms of the openings 5a formed in the gate insulating film 5, where the openings 5a of the gate insulating film 5 are formed by using the partition layer 9 as a mask.

The structure of the opposing substrate 33 side is described below.

The material of the opposing substrate 33 is not limited so long as the material is a light transmissive material and maintains insulation on the front surface. Here, for example, an insulating substrate configured by providing an insulating film on the front surface of a plastic substrate, a glass substrate, or a metal foil substrate that is thin enough to be light transmissive is used. When flexibility is necessary for the display device 30, a plastic substrate or a metal foil substrate coated with an insulating film is suitable. This is also the same for the substrate 1 on the back plane 31 side.

An opposing electrode 35 is provided on the surface of the opposing substrate 33 facing the backplane 31. The opposing electrode 35 is a common electrode for all pixels and is made of a transparent electrode material, such as ITO, that is light transmissive. The opposing electrode 35 may fully cover the opposing substrate 33.

The configuration of the electrophoretic medium layer 40 is described below.

The electrophoretic medium layer 40 is, for example, a microcapsule layer of microcapsules 49. Each microcapsule 49 is formed by sealing a dispersion medium 43 in which electrophoretic black microparticles 45 and white microparticles 47 are dispersed inside a microcapsule film 41. The microcapsule film 41 and the dispersion medium 43 are made of transparent materials. The microcapsule film 41 is, for example, composed of arabic rubber or gelatin, and the dispersion medium 43 is, for example, composed of silicone oil. The black microparticles 45 are, for example, composed of negatively charged graphite. The white microparticles 47 are, for example, composed of positively charged titanium oxide ($TiO_2$).

The microcapsules 49 having such a structure form a single layer that fills the space between the backplane 31 and the opposing substrate 33. The space between the microcapsules 49 is filled with, for example, a transparent binder polymer.

Circuit Configuration of Display Device

Figure 6:
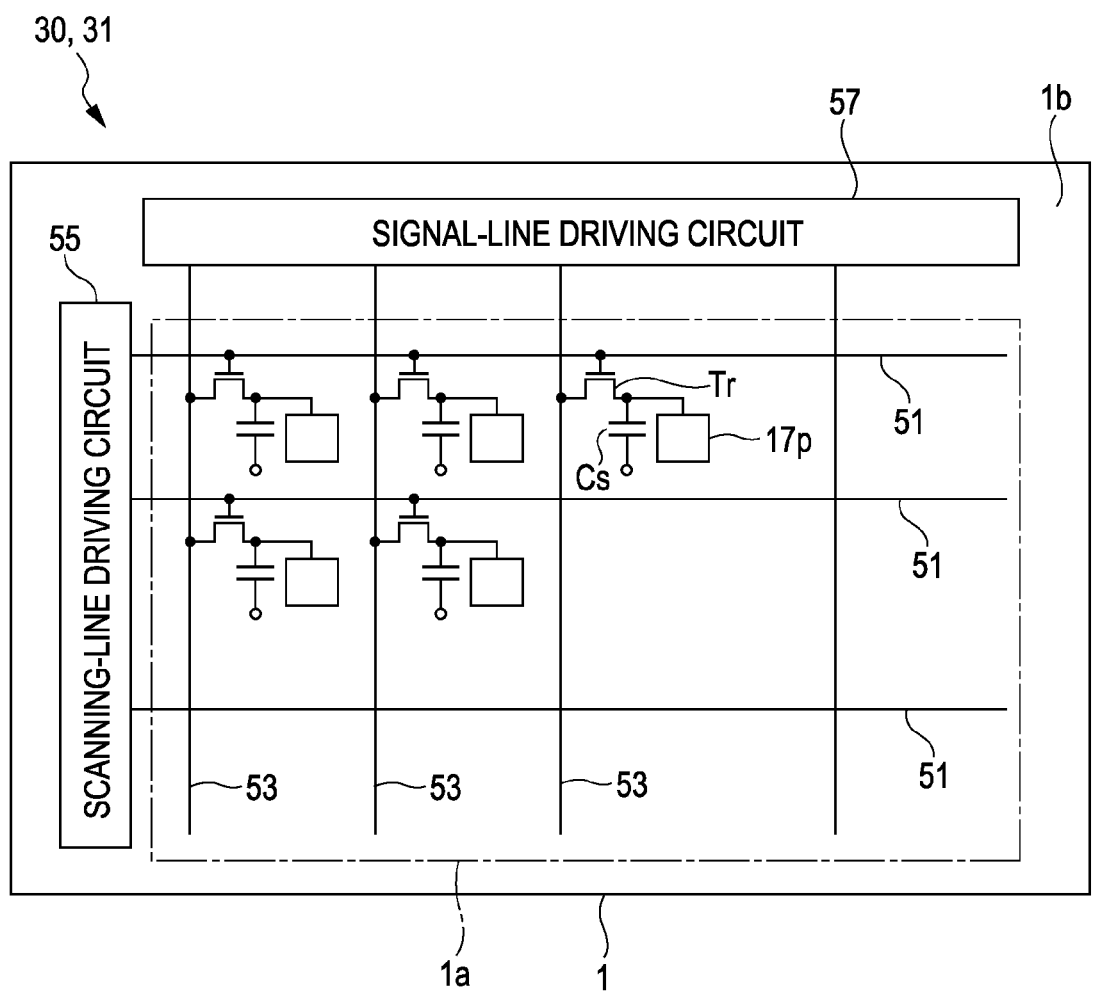
FIG. 6 is a circuit diagram of the display device according to the third embodiment.

FIG. 6 illustrates the circuit configuration of the back plane side of the display device 30 having the structure described above.

As shown in the drawing, a display area 1a and a peripheral area 1b are defined on the substrate 1 on the back plane 31 side of the display device 30. In the display area 1a, a plurality of scanning lines 51 and a plurality of signal lines 53 are arranged vertically and horizontally. The display area 1a forms a pixel arrange section in which one pixel a is disposed at each intersection of the lines. The peripheral area 1b includes a scanning-line driving circuit 55 that drives the scanning lines 51 to carry out scanning and a signal-line driving circuit 57 that supplies image signals (i.e., input signals) corresponding to luminance information to the signal lines 53.

At each of the intersections of the scanning lines 51 and the signal lines 53, a pixel circuit including the organic thin-film transistor Tr and the capacitative element Cs described in the first and second embodiments. In the organic thin-film transistor Tr, the gate electrode (3g) is connected to the scanning lines 51, and the drain electrode (7d) is connected to the signal lines 53. The source electrode (7s) of the organic thin-film transistor Tr is connected to the upper-section electrode (7c) of the capacitative element Cs and the pixel electrode 17p, as described in the first and second embodiments.

The signal lines 53 are driven by the scanning-line driving circuit 55 to write the image signals in the capacitative element Cs via the organic thin-film transistor Tr; the image signals are stored in the capacitative element Cs; and a voltage corresponding to the stored signal quantity is supplied to the pixel electrode 17p.

In this way, with the display device 30, described above, when the voltage applied to the pixel electrode 17p is positive with respect to the opposing electrode 35 on the opposing substrate 33 side, the negatively-charged black microparticles 45 move toward the pixel electrode 17p. The positively-charged white microparticles 47 move toward the opposing electrode 35. In this way, white display by light reflected at the white microparticles 47 is carried out.

On the other hand, when the voltage applied to the pixel electrode 17*p* is negative with respect to the opposing electrode 35 on the opposing substrate 33 side, the positively-charged white microparticles 47 move toward the pixel electrode 17*p*. The negatively-charged black microparticles 45 move toward the opposing electrode 35. In this way, black display by light absorbed at the black microparticles 45 is carried out.

The driving device that drives the scanning-line driving circuit 55 and the signal-line driving circuit 57 may be connected, as an external circuit, to the extraction electrodes 3*u* mounted at the edge of the substrate 1. Alternatively, the scanning-line driving circuit 55 and the signal-line driving circuit 57 may be provided as external circuits.

To produce the display device 30 having the structure described above, the electrophoretic medium layer 40 is formed on the surface on which the pixel electrode 17*p* of the backplane 31 (semiconductor device) produced according to the processes in the above-described first or second embodiment. Here, for example, an electrophoretic display element sheet formed by interposing the electrophoretic medium layer 40 between transparent films (not shown) is used. With the electrophoretic display element sheet interposed between the surface of the backplane 31 on which the pixel electrode 17*p* is formed and the surface of the opposing substrate 33 on which the opposing electrode 35 is formed, these are bonded using a heat laminator. In this way, the display device 30 is completed.

Since the display device 30 according to the above-described embodiment uses the semiconductor device of the above-described first or second embodiment as the backplane 31, production process time and production costs can be reduced. Moreover, an improvement in yield can be achieved by reducing the process steps.

In the third embodiment, a microcapsule type electrophoretic medium layer 40 is described. The electrophoretic medium layer 40, however, is not limited to a microcapsule type and may be constituted of an electrophoretic dispersion solution in which electrophoretic particles are dispersed in a dispersion medium.

In the third embodiment, an active-matrix electrophoretic display device is described. The display device according to an embodiment of the present invention, however, may be widely applied to display devices provided with organic thin-film transistors and may also be applied to liquid crystal display devices and display devices using organic electro-chemiluminescence elements.

Fourth Embodiment

FIGS. 7 to 11 illustrate example electronic equipment that includes the above-described display device according to an embodiment of the present invention as a display unit. The above-described display device according to an embodiment of the present invention can be applied to display units of electronic equipment, used in any field, for displaying image signals input to the electronic equipment and image signals generated inside the electronic equipment. Examples of electronic equipment to which the embodiments of the present invention are applied are described below.

Figure 7:
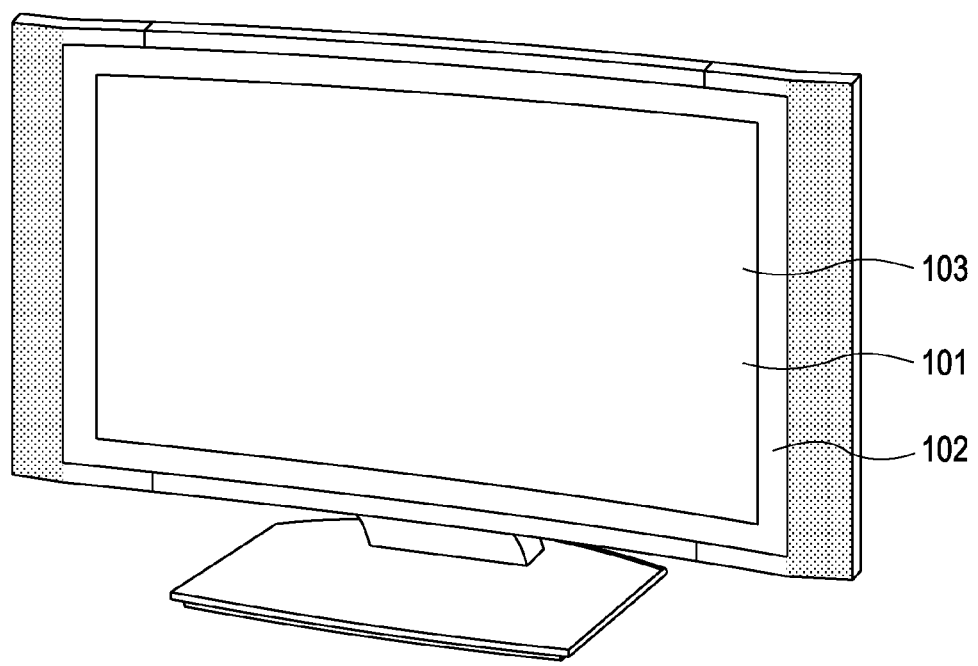
FIG. 7 is a perspective view illustrating a television set using a display device according to an embodiment of the present invention as electronic equipment according to a fourth embodiment.

FIG. 7 illustrates a perspective view of a television set to which the present invention is applied. The television according to this example of application includes an image display screen 101 having a front panel 102, a filter glass 103, etc. The display device according to an embodiment of the present invention is used as the image display screen 101.

Figure 8A:
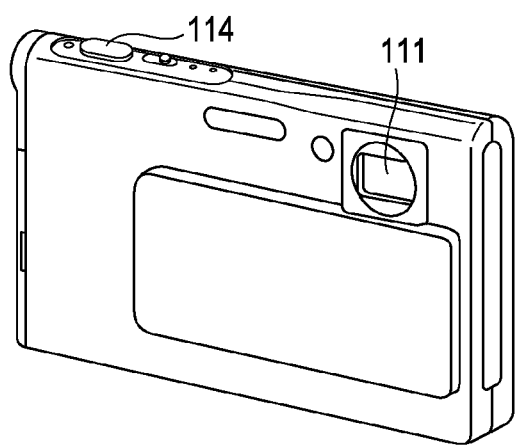
FIGS. 8A and 8B are perspective views illustrating a digital camera using a display device according to an embodiment of the present invention as electronic equipment according to a fourth embodiment, where
Figure 8B:
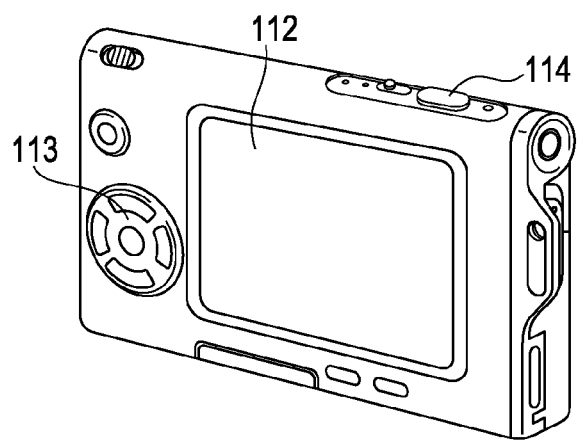

FIGS. 8A and 8B illustrate a digital camera to which the present invention is applied. FIG. 8A is a perspective view from the front, whereas FIG. 8B is perspective view from the back. The digital camera according to this example of application includes a light-emitting unit 111 for a photoflash, a display unit 112, a menu switch 113, and a shutter button 114. The display device according to an embodiment of the present invention is used as the display unit 112.

Figure 9:
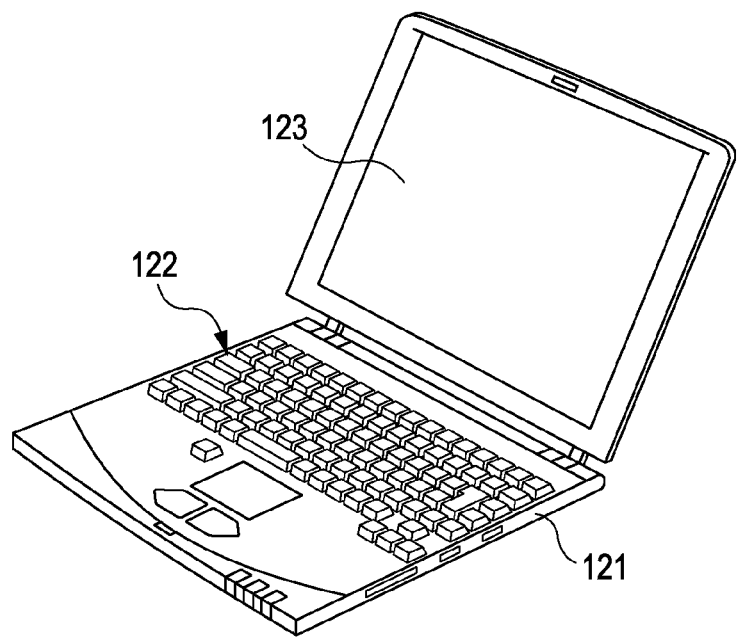
FIG. 9 is a perspective view illustrating a notebook personal computer using a display device according to an embodiment of the present invention as electronic equipment of a fourth embodiment.

FIG. 9 is a perspective view illustrating a notebook computer to which the present invention is applied. The notebook computer according to this example of application includes a main body 121, a keyboard 122 operated to input characters, etc., a display unit 123 displaying images. The display device according to an embodiment of the present invention is used as the display unit 123.

Figure 10:
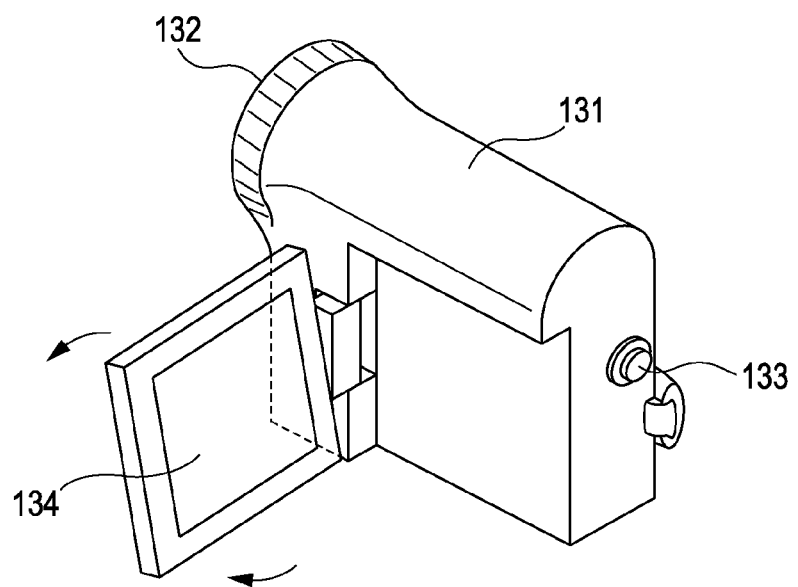
FIG. 10 is a perspective view illustrating a video camera using a display device according to an embodiment according to the present invention as electronic equipment according to a fourth embodiment.

FIG. 10 is a perspective of a video camera to which the present invention is applied. The video camera according to this example of application includes a main body 131, a lens 132 for capturing an image, which is mounted on one of the sides facing forward, a start/stop switch 133 used for image capturing, and a display unit 134. The display device according to an embodiment of the present invention is used as the display unit 134.

FIGS. 11A to 11G illustrate a portable terminal device, such as a mobile phone, to which the present invention is applied. FIG. 11A is a front view in an open state; FIG. 11B is a side view in the open state; FIG. 11C is a front view in a closed state; FIG. 11D is a left side view; FIG. 11E is a right side view; FIG. 11F is top view; and FIG. 11G is bottom view. The mobile phone according to this example of application includes an upper case 141, a lower case 142, a connecting part (here, a hinge) 143, a display 144, a sub-display 145, a picture light 146, and a camera 147. The display device according to an embodiment of the present invention is used as the display 144 and the sub-display 145.

In the embodiments described above, electronic equipment using the display device in which the semiconductor device of the first or second embodiment is provided as the back plane is described. The semiconductor device according to an embodiment of the present invention is not limited to the installation in a display device and, instead, may be used in electronic equipment such as ID tags and sensors to achieve the same advantages.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   first layer wiring including a gate electrode mounted on a substrate;
   a gate insulating film having at least one wiring-exposing opening that exposes part of the first layer wiring but that otherwise covers the entire surface of the substrate including the gate electrode;
   second layer wiring including a source electrode and a drain electrode mounted on the gate insulating film at opposite sides of the gate electrode, neither the source electrode nor the drain electrode being exposed to the at least one opening;
   an insulating partition layer having a first opening that exposes an edge portion of each of the source electrode and the drain electrode and a part of the gate insulating film between the source electrode and the drain electrode and at least one second opening, each second opening being concentric with a respective wiring-exposing opening formed in the gate insulating film;

an organic semiconductor layer extending over the exposed edges of the source electrode and the drain electrode and on the bottom surface of the first opening formed in the insulating partition layer, but not contacting with the insulating partition layer; and a protective film directly on the organic semiconductor layer and filing said first opening in said insulating partition layer.

2. The semiconductor device according to claim 1, wherein:
a third opening that reaches the second layer wiring is formed in the partition layer, and
third layer wiring connected to the second layer wiring via the third opening is formed in the partition layer.

3. The semiconductor device according to claim 2, wherein the third layer wiring is connected to the first layer wiring via the second opening.

4. The semiconductor device according to claim 1, wherein an insulating protective film extends over a portion of said insulating partition layer.

5. The semiconductor device according to claim 1, wherein:
a third opening reaching the second layer wiring is formed in the partition layer,
an inter-layer insulating film covering the partition layer is disposed on the substrate,
the inter-layer insulating film has an opening exposing the first layer wiring at the bottom of the second opening formed in the partition layer and an opening reaching the second layer wiring at the bottom of the third opening formed in the partition layer, and
third layer wiring connected to the second layer wiring is mounted on the inter-layer insulating film at the bottom of the third opening.

6. The semiconductor device according to claim 5, wherein the third layer wiring is connected to the first layer wiring at the bottom of the second opening.

7. The semiconductor device according to claim 5, wherein an insulating protective film extends over a portion of said insulating partition layer.

8. The semiconductor device according to claim 1, wherein an end section of the first layer wiring is exposed at the periphery of the substrate in the at least one wiring exposing opening in the gate insulating film and at the bottom of the second opening in the partition layer.

9. A display device comprising:
first layer wiring including a gate electrode mounted on a substrate;
a gate insulating film having at least one wiring-exposing opening that exposes part of the first layer wiring but that otherwise covers the entire surface of the substrate including the gate electrode;
second layer wiring including a source electrode and a drain electrode mounted on the gate insulating film at opposite sides of the gate electrode, neither the source electrode nor the drain electrode being exposed to the at least one opening;
an insulating partition layer having (a) a first opening that exposes an edge portion of each of the source electrode and the drain electrode and a part of the gate insulating film between the source electrode and the drain electrode, (b) at least one second opening, each second opening being concentric with a respective wiring-exposing opening formed in the gate insulating film, and (c) a third opening reaching the source electrode or the drain electrode;
an organic semiconductor layer over the exposed edges of the source electrode and the drain electrode and on the bottom surface of the first opening formed in the insulating partition layer, but not contacting with the insulating partition layer;
a pixel electrode mounted on the partition layer in such a manner that the pixel electrode is connected to the source electrode or the drain electrode via the third opening; and
a protective film directly on the organic semiconductor layer and filing said first opening in said insulating partition layer.

10. The display device according to claim 9, further comprising connection wiring connected to the source electrode or the drain electrode via the third opening and mounted on the partition layer in such a manner that the connection wiring connected to the first layer wiring via the second opening.

11. The display device according to claim 9, wherein an end section of the first layer wiring is exposed at the periphery of the substrate at the at least one wiring exposing opening in the gate insulating film and at the bottom of the second opening in the partition layer.

12. Electronic equipment comprising:
a display device; and
a driving device configured to drive the display device,
wherein, the display device includes
(a) first layer wiring including a gate electrode mounted on a substrate,
(b) a gate insulating film having at least one wiring-exposing opening that exposes part of the first layer wiring but that otherwise covers the entire surface of the substrate including the gate electrode,
(c) second layer wiring including a source electrode and a drain electrode mounted on the gate insulating film at opposite ends of the gate electrode, neither the source electrode nor the drain electrode being exposed to the at least one opening,
(d) an insulating partition layer having (1) a first opening that exposes an edge portion of each of the source electrode and the drain electrode and a part of the gate insulating film between the source electrode and the drain electrode, (2) at least one second opening, each second opening being concentric with a respective wiring-exposing opening formed in the gate insulating film, and (3) a third opening reaching the source electrode or the drain electrode,
(e) an organic semiconductor layer extending over the exposed edges of the source electrode and the drain electrode and on the bottom surface of the first opening formed in the insulating partition layer, but not contacting with the insulating partition layer,
(f) a protective film directly on the organic semiconductor layer and filing said first opening in said insulating partition layer; and
(g) a pixel electrode mounted on the partition layer in such a manner that the pixel electrode is connected to the source electrode or the drain electrode via the third opening.

* * * * *